(12) United States Patent
Chen et al.

(10) Patent No.: US 7,695,151 B2
(45) Date of Patent: Apr. 13, 2010

(54) ILLUMINATING DEVICE

(75) Inventors: Chen-Lun Hsing Chen, Taoyuan Hsien (TW); Jung-Hao Hung, Taoyuan Hsien (TW); Hsu-Keng Tseng, Taoyuan Hsien (TW)

(73) Assignee: Prolight Opto Technology Corporation, Taoyuan Hsien (TW)

( * ) Notice: Subject to any disclaimer, the term of this patent is extended or adjusted under 35 U.S.C. 154(b) by 223 days.

(21) Appl. No.: 12/076,594

(22) Filed: Mar. 20, 2008

(65) Prior Publication Data

US 2009/0237926 A1 Sep. 24, 2009

(51) Int. Cl.
*F21V 9/16* (2006.01)
*F21V 9/00* (2006.01)

(52) U.S. Cl. .......................... 362/84; 362/231; 362/800

(58) Field of Classification Search .................. 362/230, 362/231, 84, 555, 800; 257/79, 98, 100, 257/103
See application file for complete search history.

(56) References Cited

U.S. PATENT DOCUMENTS 7,053,560 B1 * 5/2006 Ng ........................ 315/185 R
7,163,313 B2 * 1/2007 Rosenberg .................. 362/184

* cited by examiner

*Primary Examiner*—Bao Q Truong
(74) *Attorney, Agent, or Firm*—Jackson IPG PLLC

(57) ABSTRACT

The illuminating device of the invention comprises at least one lighting component, red lighting component, current limiting component and fluorescent body, wherein said red lighting component is first series connected with said current limiting component, and further parallel connected with said lighting component, so that input current to red lighting component is controlled by said current limiting component to be smaller than input current to lighting component, thereby said fluorescent body receiving and triggering the light emitted by said lighting component is mixed with the light emitted by said red lighting device to emit a white light with high lighting efficient and high color rendering white light.

13 Claims, 5 Drawing Sheets

ILLUMINATING DEVICE

BACKGROUND OF THE INVENTION (a) Field of the Invention

The invention is related to an illuminating device to disclose an illuminating device which is capable of promoting white light color rendering.

(b) Description of the Prior Art

FIG. 1 is a cure diagram of natural sun light (natural white light), the light wavelength in said Fig. is between 360~750 nm.

In order to manufacture a white light illuminating device with wavelength near natural sunlight (white light), the Taiwan patent no. 383508 "illuminating device and display device" disclosed that a blue light emitter diode is used as the blue light source to be triggered by a fluorescent body to emit a light of a wavelength different from blue light, and said light of different wavelength is mixed with the untriggered blue light to obtain the white light, whereby comparing the spectrum curve S1 (as shown in FIG. 2) of said white light with the curve of natural white light (sunlight) in FIG. 1, it is known that the deviation between said two curves is quite large which is mainly due to the white light defined by mixing the longer wavelength light from the fluorescent body triggered by blue light and the untriggered blue light obviously has a poor color rendering in comparison with natural sunlight, wherein said color rendering is between 40~80.

Similarly, as white light emitter diode is not used, the embodiment by the red, green or blue light emitter diode, or by the combination of UV light emitter diode and fluorescent body is employed for resolution, such as that it is commonly seen on the street to add red fluorescent bodies for promoting the color renderingness, however most red florescent bodies contain sulfides which may corrode chips or sealing material after wetted by adsorption to cause fast decay of lightness and reliability problems for the whole light emitter diode. Further since human eyes have poorer sensitivity for red light wavelength region, the color renderness can be promoted by transforming more blue light energy of said light emitter diode to red light, however the lightness will go down by 30~50% at present to have a poorer lighting efficiency.

SUMMARY OF THE INVENTION

In view of this, the invention discloses an illuminating device capable of promoting white light color rendering.

To achieve the above purpose, the illuminating device of the invention comprises at least the following: at least one lighting component, red lighting component, current limiting component and fluorescent body, wherein said red lighting component is first series connected with said current limiting component, and further parallel connected with said lighting component, whereby input current to red lighting component is controlled by said current limiting component to be smaller than input current to lighting component, thereby said fluorescent body receiving and triggering the light emitted by said lighting component is mixed with the light emitted by said red lighting device to emit a white light with high lighting efficiency and high color rendering.

DETAIL DESCRIPTION OF THE PREFERRED EMBODIMENTS

Figure 1:
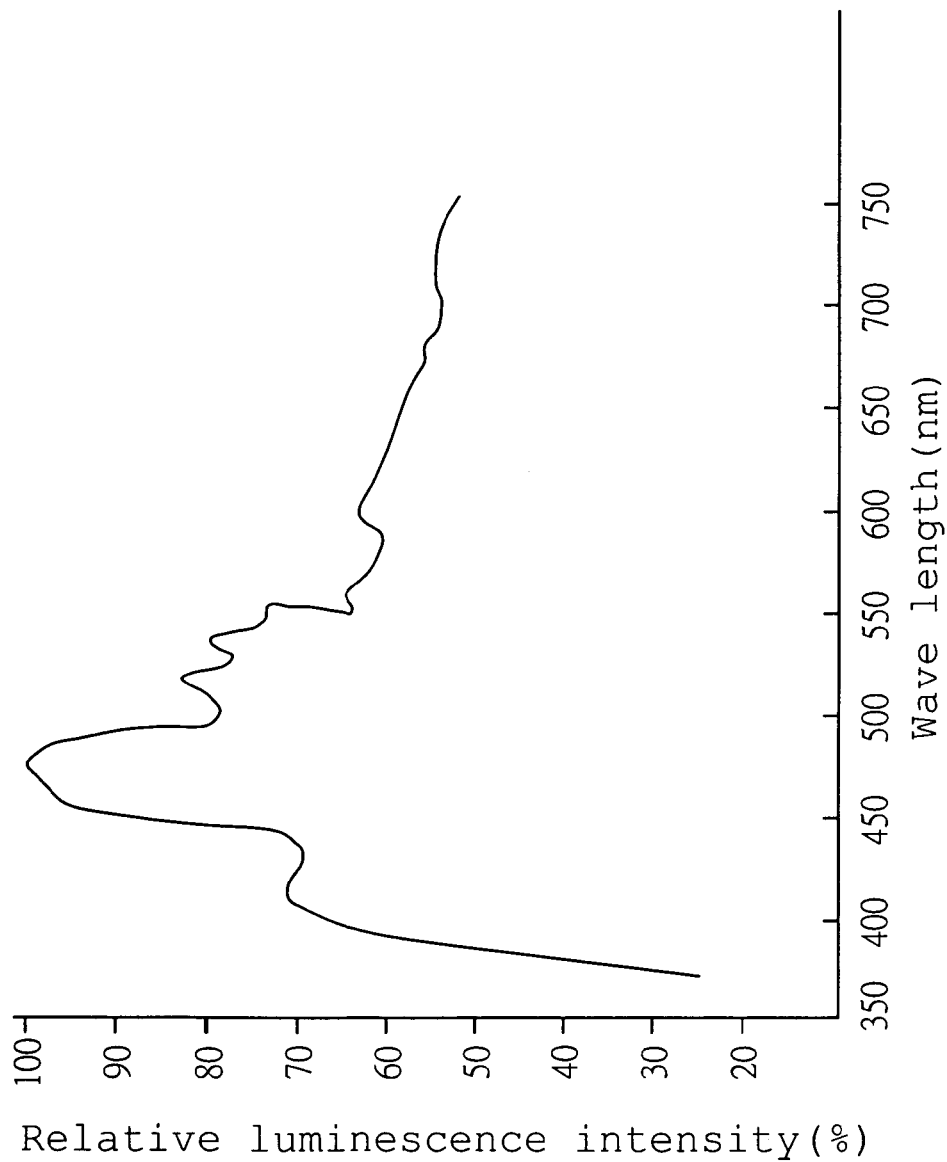
FIG. 1 is the spectrum curve diagram of the known natural sunlight.
Figure 2:
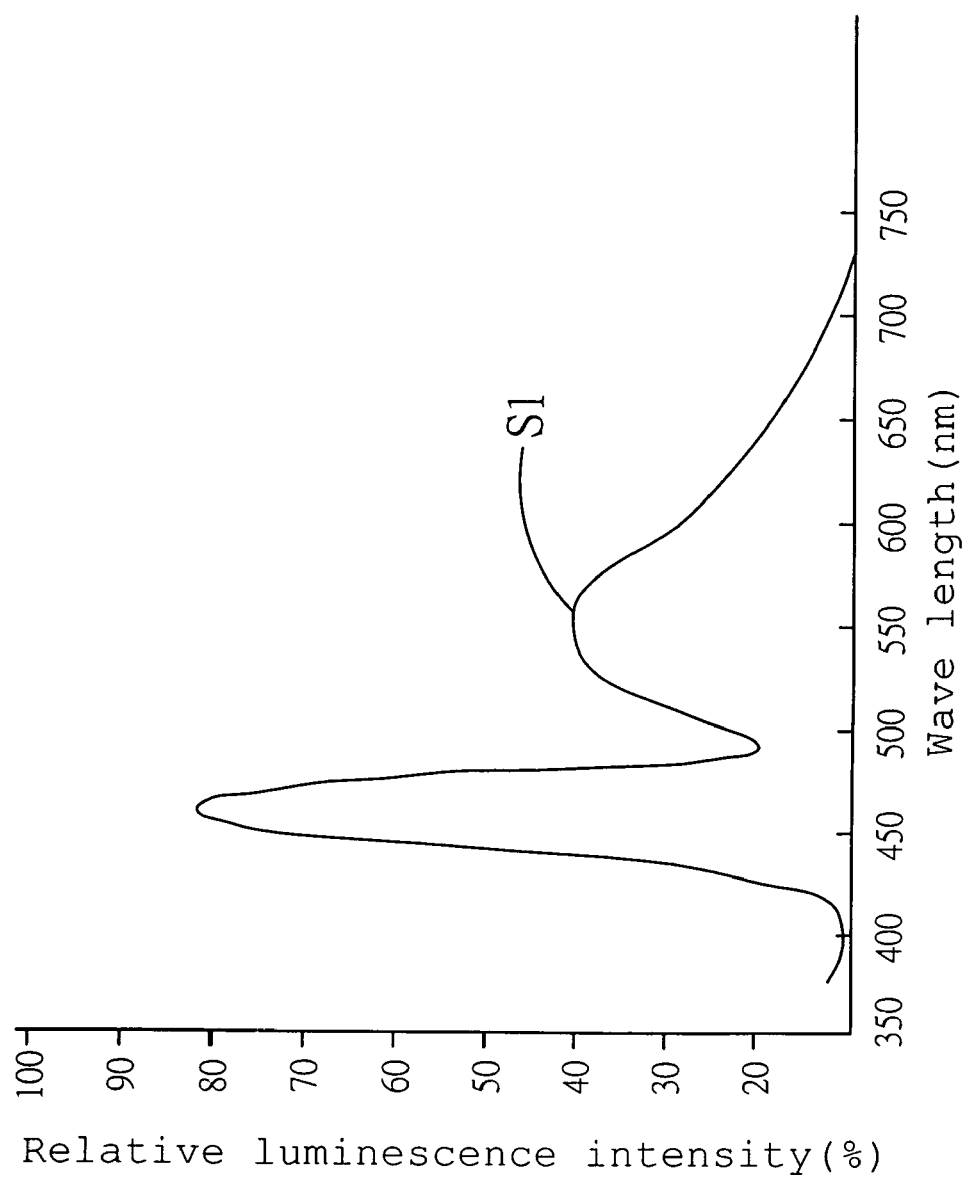
FIG. 2 is the spectrum curve diagram of the known blue light source triggering fluorescent layer.
Figure 3:
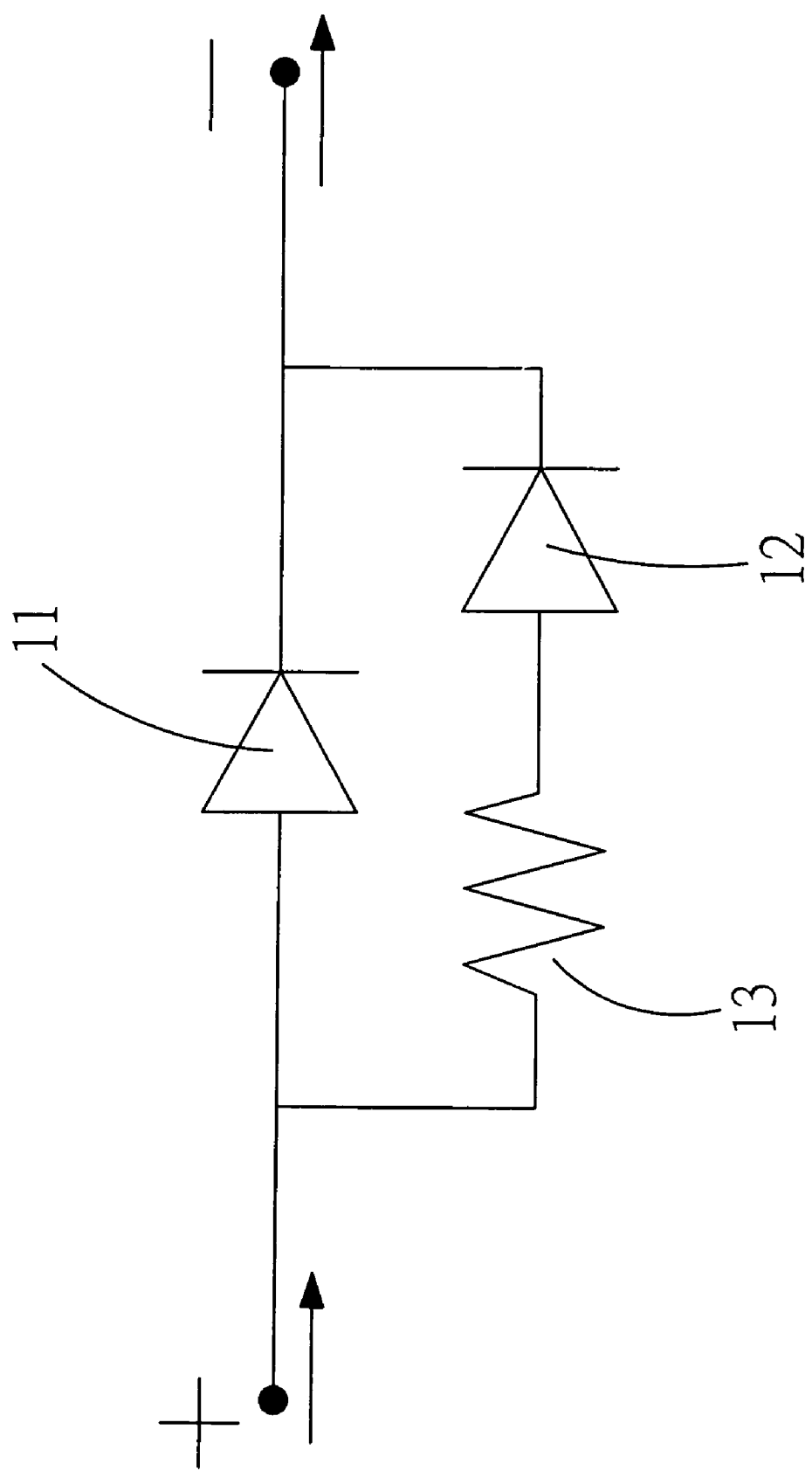
FIG. 3 is the circuit layout schematic view of the illuminating device of the invention.

The illuminating device of the invention is as shown in FIG. 3, wherein said illuminating device 1 comprises at least the following:

At least one lighting component 11 has a center wavelength of 270~480 nm to emit the light ranging from UV (Center wavelength larger than 270 nm) to blue (center wavelength is larger than 430~480 nm);

At least one red lighting component 12 has a center wavelength of 600~680 nm, and unquestionably, said lighting component 11 or said red lighting component 12 can be a high power lighting component;

At least one current limiting component 13 is series connected with said red lighting component 12, and said current limiting component 13 and said red lighting component 12 are parallel connected with said lighting component 11, wherein said current limiting component 13 can be a resistor or IC electronic parts, and said current limiting component 13 is used for adjusting input current to said red lighting component 12;

A fluorescent body 14 is installed around said lighting component 11 to receive and trigger the light emitted by said lighting component 11, wherein said fluorescent body 14 has yellow fluorescent powders at inside thereof.

Figure 4:
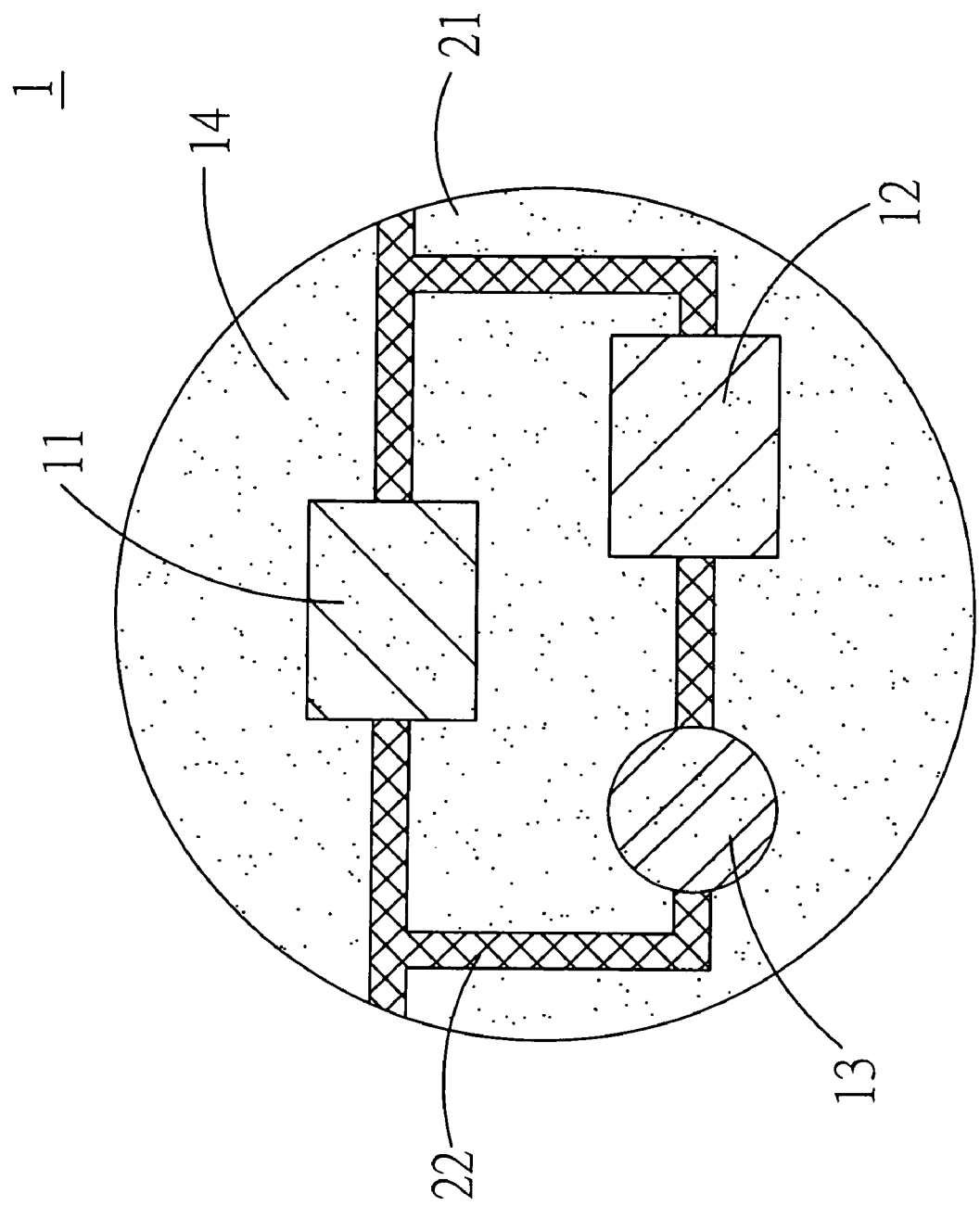
FIG. 4 is a structural schematic view of the first embodiment of the invented illuminating device.

As shown by the first embodiment in FIG. 4, said illuminating device 1 is further installed with a substrate 21 having a graphical circuit to install with said blue and red lighting components 11, 12 as well as current limiting component 13 thereon, said blue and red lighting components 11, 12 and said current limiting component 13 are sealed and covered by said fluorescent body 14, the graphical circuit 22 preset on said substrate 21 allow the current to form equal distributed current of same values (such as 1 Amperes) for flowing into the lighting component 11 and the current limiting component 13 respectively, at the same time, one partial current is passing through said current limiting component 13 to have a current drop (such as 0.01 Amperes) and further input to red lighting component 12, while another distributed current is directly input to lighting component 11, the light emitted by which is triggered by fluorescent body 14 and form the first light source together with the untriggered blue light, and said first light source is further mixed with the red light emitted by red lighting component 12 to produce a white light with better lighting efficiency and high color renderness, wherein unquestionably, said substrate can be a circuit board, a lead frame or a ceramic substrate, or said substrate can be further embedded with at least one heat sink.

Figure 5:
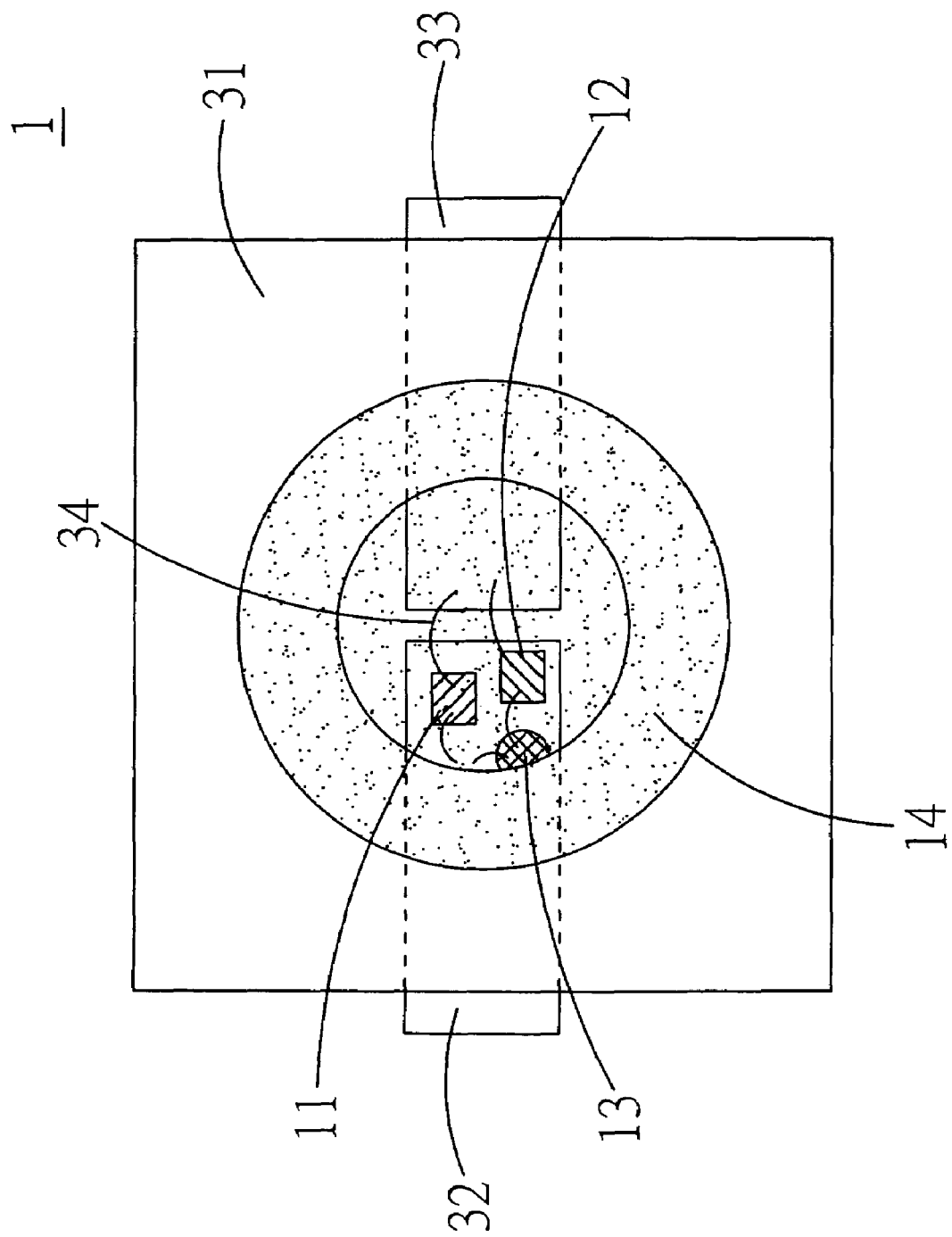
FIG. 5 is a structural schematic view of the second embodiment of the invented illuminating device.

In addition, as shown by the second embodiment of the invention in FIG. 5, said illuminating device 1 is further installed with a casing 31 having at least two separated frames 32, 33 at the inside thereof to extend outwardly outside of said casing 31 from inside thereof. Said blue and red lighting components 11, 12 as well as current limiting component 13 are installed at one said frame 32, wherein said frames 32, 33 are electrically connected by such as gold wire 34, while lighting component 11, red lighting component 12 and current limiting component 13 are sealed and covered by fluorescent body 14.

It is worthy to mention that in the invention, a blue light is first mixed with florescent powders to form a white light, and further through mixing the red light of longer wavelength with said white light to obtain the new white light with a better color renderness, in addition, lighting power of red lighting component is adjusted through controlling the input current to red lighting component by said current limiting component, not only that the white light with a better color renderness can be obtained, the lightness of the whole illuminating device is also unaffected.

As described from the above, the invention discloses a better workable illuminating device, hence it is applied for patent according to law. Nonetheless, descriptions for the above embodiments and accompanied Figs. are for preferred embodiments of the invention and shall not limit the scope of the invention, therefore, all similar or identical structures, devices, and characteristics of the invention shall be belong to the purposes and claimed scope of the invention.

We claim,

1. An illuminating device comprises at least the following:
    at least one lighting component;
    at least one red lighting component has a center wavelength of 600~680 nm;
    at least one current limiting component is series connected with said red lighting component, and said current limiting component and said red lighting component are parallel connected with said lighting component;
    a fluorescent body is installed around said lighting component to receive and trigger the light emitted by said lighting component.
2. The illuminating device as claimed in claim 1, wherein said illuminating device is further installed with a substrate having a graphical circuit to install with said blue and red lighting components as well as current limiting component thereon, while said blue and red lighting components and said current limiting component are sealed and covered by said fluorescent body.
3. The illuminating device as claimed in claim 2, wherein said substrate can be a circuit board, a lead frame or a ceramic substrate.
4. The illuminating device as claimed in claim 2, wherein said substrate can be further embedded with at least one heat sink.
5. The illuminating device as claimed in claim 1, wherein said illuminating device is further installed with a casing having at least two separated frames at the inside thereof to extend outwardly outside of said casing from inside thereof.
6. The illuminating device as claimed in claim 5, wherein said blue and red lighting components as well as current limiting component are installed at one of said frames, wherein said frames are electrically connected, while blue and red lighting components and current limiting component are sealed and covered by fluorescent body.
7. The illuminating device as claimed in claim 1, wherein said current limiting component can be a resistor.
8. The illuminating device as claimed in claim 1, wherein said current limiting component can be IC electronic parts.
9. The illuminating device as claimed in claim 1, wherein said fluorescent body has yellow fluorescent powders at inside thereof.
10. The illuminating device as claimed in claim 1, wherein said lighting component has a center wavelength of 270~480 nm to emit the light ranging from UV to blue light.
11. The illuminating device as claimed in claim 1, wherein said lighting component center wavelength is 430~480 nm, and the emitted light thereof can be a blue light.
12. The illuminating device as claimed in claim 1, wherein said lighting component center wavelength is larger than 270 nm, and the emitted light thereof can be an UV light.
13. The illuminating device as claimed in claim 1, wherein said lighting component or said red lighting component can be a high power lighting component.

* * * * *